(12) United States Patent
Uzoh et al.

(10) Patent No.: US 12,740,487 B2
(45) Date of Patent: Sep. 15, 2026

(54) STRONG BONDING STRUCTURES AND METHODS OF FORMING THE SAME

(71) Applicant: Adeia Semiconductor Bonding Technologies Inc., San Jose, CA (US)

(72) Inventors: Cyprian Emeka Uzoh, San Jose, CA (US); Belgacem Haba, Saratoga, CA (US); Rajesh Katkar, Milpitas, CA (US); Oliver Zhao, Daly City, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 361 days.

(21) Appl. No.: 18/541,676

(22) Filed: Dec. 15, 2023

(65) Prior Publication Data

US 2025/0201739 A1 Jun. 19, 2025

(51) Int. Cl.

| | |
|---|---|
| ***H10W 90/00*** | (2026.01) |
| ***H10W 72/00*** | (2026.01) |
| ***H10W 72/90*** | (2026.01) |
| ***H10W 80/00*** | (2026.01) |

(52) U.S. Cl.

CPC .......... *H10W 90/00* (2026.01); *H10W 72/019* (2026.01); *H10W 72/01931* (2026.01); *H10W 72/01951* (2026.01); *H10W 72/01971* (2026.01); *H10W 72/0198* (2026.01); *H10W 72/953* (2026.01); *H10W 80/312* (2026.01); *H10W 80/327* (2026.01); *H10W 90/794* (2026.01)

(58) Field of Classification Search

CPC ............. H10W 80/327; H10W 80/011; H10W 80/016; H10W 80/023; H10P 10/126

See application file for complete search history.

(56) References Cited

U.S. PATENT DOCUMENTS

| | | | |
|---|---|---|---|
| 6,303,518 B1 | 10/2001 | Tian et al. | |
| 8,871,636 B2 | 10/2014 | Farooq et al. | |
| 10,204,893 B2 | 2/2019 | Uzoh et al. | |
| 11,476,213 B2 | 10/2022 | Haba et al. | |
| 2008/0268614 A1* | 10/2008 | Yang | H10P 52/00 438/455 |
| 2017/0301611 A1* | 10/2017 | Cheng | H10D 86/0214 |
| 2020/0006277 A1* | 1/2020 | Wang | H10P 10/126 |
| 2022/0310559 A1 | 9/2022 | Chan et al. | |
| 2023/0187264 A1 | 6/2023 | Uzoh et al. | |

FOREIGN PATENT DOCUMENTS

WO 2004/105084 A2 12/2004

* cited by examiner

*Primary Examiner* — Vincent Wall
(74) *Attorney, Agent, or Firm* — HG Law LLP

(57) ABSTRACT

A method of bonding substrates comprises depositing a fluorine-doped dielectric layer on a first substrate, exposing the fluorine-doped dielectric layer to a hydrogen-containing plasma, and directly bonding the fluorine-doped dielectric layer to a surface of a second substrate without the use of an intervening adhesive.

20 Claims, 11 Drawing Sheets

STRONG BONDING STRUCTURES AND METHODS OF FORMING THE SAME

FIELD

The present disclosure relates to advanced packaging of semiconductor devices, and in particular, to bonding methods and device assemblies formed using the same.

SUMMARY

Embodiments herein provide for improved bonding materials used to form bonds between substrates. One or more bonding materials comprise a fluorine-doped dielectric layer (e.g., a fluorine-doped silicate glass (FSG) layer). Advantageously, use of one or more improved bonding materials comprising a fluorine-doped dielectric layer in direct bonding (e.g., FSG-$SiO_2$, FSG-FSG bonding) enable producing higher average bonding energy than directly bonding dielectric layers that are not fluorine-doped.

Use of a fluorine-doped dielectric layer in bonding may be applied to heterogeneous integration (differential coefficient of thermal expansion (CTE)) and die with differential warpage. Use of fluorine-doped dielectric layer in bonding may be applied to power applications, high power applications, radio frequency (RF) applications, and/or high frequency applications. A fluorine-doped dielectric layer may have a dielectric constant that is lower than a dielectric layer that is not fluorine-doped. Use of a fluorine-doped dielectric layer with a lower dielectric constant than a dielectric layer that is not fluorine-doped may be beneficial in high performance systems or high frequency applications in which a low RC delay is desired.

A fluorine-doped dielectric layer may have problems with bonding (e.g., delamination of substrates) due to desorption of moisture and/or presence of reactive or unbonded fluorine in the fluorine-doped dielectric layer. To improve bonding of a fluorine-doped dielectric layer, the fluorine-doped dielectric layer may be deposited with a low concentration of fluorine (e.g., less than about 4%, such as less than about 3%), annealed, and/or exposed to hydrogen plasma prior to bonding. In some embodiments, having a low concentration of fluorine may improve bond strength by reducing the concentration of unreacted fluorine (e.g., reactive or unbonded fluorine) in the fluorine-doped dielectric layer. Having a low concentration of unreacted fluorine may reduce absorption of moisture in the fluorine-doped dielectric layer, or may reduce a concentration or presence of reactive or unbonded fluorine. In some embodiments, annealing the fluorine-doped dielectric layer prior to bonding may improve bond strength by removing moisture from the fluorine-doped dielectric layer. In some embodiments, exposing the fluorine-doped dielectric layer to hydrogen plasma prior to bonding may improve bond strength by causing the unbonded fluorine to react (e.g., to form HF) and reducing the concentration of unbonded fluorine in the fluorine-doped dielectric layer.

One general aspect includes a method of forming bonds between first and second substrates. The method includes preparing a first substrate for bonding including depositing a fluorine-doped dielectric layer on a first substrate and exposing the fluorine-doped dielectric layer to hydrogen-containing plasma. The method further includes directly bonding the fluorine-doped dielectric layer to a surface of the second substrate without the use of an intervening adhesive.

In some embodiments, the method may include, prior to depositing the fluorine-doped dielectric layer on the first substrate, activating a surface of the first substrate. Activating a surface may comprise exposing a surface to a nitrogen-containing solution, a nitrogen-containing plasma, or some combination thereof to create dangling bonds on a surface. In some embodiments, any suitable surface may be activated. For example, a surface of the first substrate, second substrate, a fluorine doped dielectric layer of the first substrate, a dielectric layer (e.g., fluorine-doped dielectric layer or a dielectric layer that is not doped with fluorine) of the second substrate, conductive features disposed in a fluorine doped dielectric layer of the first substrate, and/or conductive features disposed in a dielectric layer of the second substrate may be activated.

In some embodiments, the fluorine-doped dielectric layer of the first substrate comprises an FSG layer. A concentration of fluorine in the fluorine-doped dielectric layer of the first substrate may be less than about 4%, such as less than about 3%. The method may include, prior to exposure to hydrogen plasma, activating a surface of the fluorine-doped dielectric layer of the first substrate.

In some embodiments, the method may further comprise, concurrently with exposing the fluorine-doped dielectric layer of the first substrate to the hydrogen-containing plasma, heating the first substrate to a temperature between about 150° C. to about 200° C. The exposure of the fluorine-doped dielectric layer of the first substrate to hydrogen-containing plasma and heating of the first substrate may eliminate or reduce excess fluorine in the fluorine-doped dielectric layer. For example, the exposure to hydrogen-containing plasma may eliminate unbonded fluorine as hydrogen fluoride (HF). The fluorine-doped dielectric layer of the first substrate may comprise a substantially uniform concentration of fluorine.

In some embodiments, the method may include, polishing a surface of the fluorine-doped dielectric layer of the first substrate. For example, a surface of the fluorine-doped dielectric layer of the first substrate may be polished using a chemically mechanical polishing (CMP) process. The surface of the fluorine-doped dielectric layer of the first substrate may be polished at any suitable stage of the process of preparing the first substrate (e.g., before or after activation, before or after exposure to hydrogen-containing plasma). For example, the surface of the fluorine-doped dielectric layer may be polished after deposition and before activation of the fluorine-doped dielectric layer. In another example, the surface of the fluorine-doped dielectric layer may be polished after exposure to hydrogen-containing plasma. The method may include, prior to bonding, cleaning a surface of the first substrate.

In some embodiments, the fluorine-doped dielectric layer of the first substrate is a first dielectric layer, and the second substrate comprises a second dielectric layer. In some embodiments, the second dielectric layer may comprise a dielectric layer that is not fluorine-doped. For example, the second dielectric layer may comprise an $SiO_2$ material. In some embodiments, the second dielectric layer may be fluorine-doped. For example, the second dielectric layer may comprise an FSG layer.

In some embodiments, the method may include, prior to directly bonding to the first substrate, activating a surface of the second substrate. In some embodiments, the method may include activating a surface of a dielectric layer of the second substrate. In some embodiments, the method may include activating a surface of a fluorine-doped dielectric layer of the second substrate.

In some embodiments, the method includes hybrid bonding the first substrate and the second substrate. For example, preparing the first substrate for bonding further comprises forming first conductive features in the first dielectric layer. The method may further comprise bonding the first conductive features to second conductive features disposed in the second dielectric layer.

In some embodiments, the method may include, prior to hybrid bonding to the first substrate, activating a surface of the second substrate. The method may include activating a surface of conductive features disposed in a dielectric layer that is not fluorine-doped or a fluorine-doped dielectric layer.

Another general aspect includes a method of bonding substrates such as die to substrate bonding. In some embodiments, a method includes depositing a fluorine-doped dielectric layer on a first substrate and exposing the fluorine-doped dielectric layer to a hydrogen-containing plasma. The method includes singulating one of a first substrate or a second substrate into individual dies and directly bonding one or more individual dies to the remaining unsingulated substrate without the use of an intervening adhesive.

Another general aspect includes a method of bonding substrates such as stacked die to substrate bonding. In some embodiments, a method includes depositing a fluorine-doped dielectric layer on a first substrate and exposing the fluorine-doped dielectric layer to a hydrogen-containing plasma. The method includes singulating one of the first substrate, a second substrate, or a third substrate into individual first dies, and singulating one of the remaining unsingulated substrates into individual second dies. The method includes bonding one or more individual first dies to the remaining unsingulated substrate without the use of an intervening adhesive, and directly bonding one or more individual second dies to the one or more individual first dies bonded to the remaining unsingulated substrate without the use of an intervening adhesive.

Another general aspect includes a method of bonding substrates such as a reconstituted substrate to substrate bonding. In some embodiments, a method includes attaching a plurality of individual dies to a first substrate, depositing a fluorine-doped dielectric layer on the first substrate, wherein at least a portion of the fluorine-doped dielectric layer is between adjacent individual dies, and polishing the fluorine-doped dielectric layer. The method includes exposing the fluorine-doped dielectric layer to a hydrogen-containing plasma, and directly bonding the fluorine-doped dielectric layer to a surface of a second substrate without the use of an intervening adhesive.

In other embodiments, a method includes attaching a plurality of individual dies to a first substrate, depositing a first dielectric layer on the first substrate, wherein at least a portion of the first dielectric layer is between adjacent individual dies, polishing the first dielectric layer, depositing a second dielectric layer on the first dielectric layer, wherein the second dielectric layer is fluorine-doped, and polishing the second dielectric layer. The method includes exposing the second dielectric layer to a hydrogen-containing plasma, and directly bonding the second dielectric layer to a surface of a second substrate without the use of an intervening adhesive.

Another general aspect includes a device assembly comprising a device with bonded features. The bonded features comprise a fluorine-doped material within the bonded features. A concentration of fluorine in at least a portion of the fluorine-doped dielectric material corresponding to at least one feature of the bonded features is less than about 4%, such as less than about 3%.

Another general aspect includes a device assembly comprising a device with bonded features. The bonded features comprise a fluorine-doped dielectric material within the bonded features, and a thickness of the fluorine-doped dielectric material is thinner than a thickness of a dielectric layer above or below the fluorine-doped dielectric material.

Another general aspect includes a device assembly comprising a device with bonded features. The bonded features comprise a fluorine-doped dielectric material within the bonded features, and the fluorine-doped dielectric material comprises a bonding surface of one of the bonded features.

BRIEF DESCRIPTION OF THE DRAWINGS

The above and other objects and advantages of the disclosure will be apparent upon consideration of the following detailed description, taken in conjunction with the accompanying drawings.

Figure 1A:
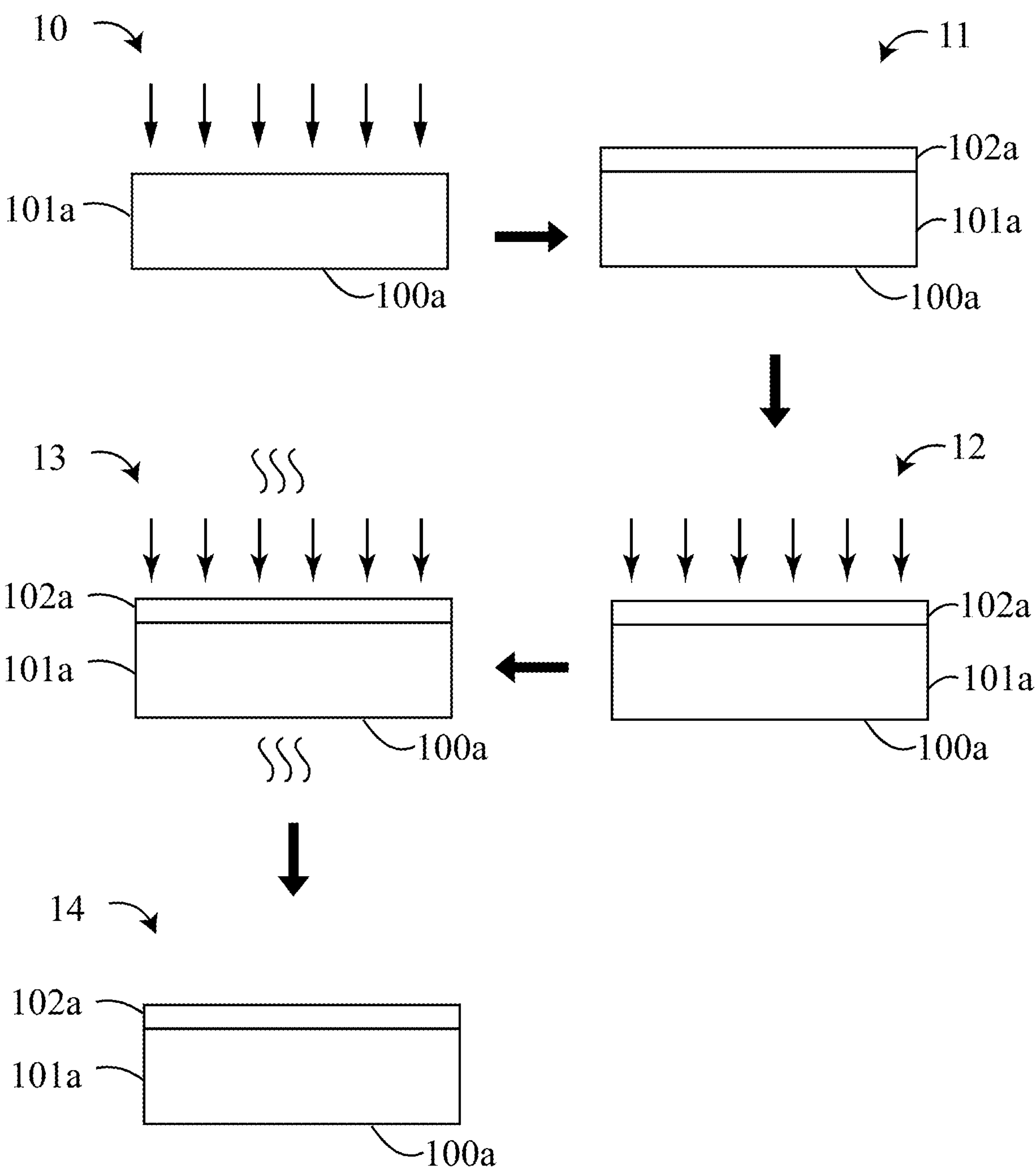
FIG. 1A schematically illustrates aspects of a method of preparing a substrate with a fluorine-doped dielectric layer for bonding, according to some embodiments.

The figures herein depict various embodiments of the disclosure for purposes of illustration only. It will be appreciated that additional or alternative structures, assemblies, systems, and methods may be implemented within the principles set out by the present disclosure.

DETAILED DESCRIPTION

Embodiments herein provide for improved bonding materials used form bonds between substrates. The improved bonding materials include one or more fluorine-doped dielectric layers (e.g., FSG layers) on one or more substrates of the bonded substrates that may enable higher bonding energies between substrates (e.g., FSG-$SiO_2$, FSG-FSG) compared to bonding with dielectric layers that are not doped with fluorine. Embodiments disclosed herein may enable an average bond energy at 1 second of more than about 3000 mJ/$m^2$, or of more than about 3100 mJ/$m^2$, or of more than about 3200 mJ/$m^2$, or of more than about 3300 mJ/$m^2$, or of more than about 3400 mJ/$m^2$, or of more than about 3500 mJ/$m^2$, or of more than about 4000 mJ/$m^2$, or of more than about 5000 mJ/$m^2$. Embodiments disclosed herein may enable an average bond energy at 2 min of more than about 1250 mJ/$m^2$, or of more than about 1500 mJ/$m^2$, or of more than about 2000 mJ/$m^2$, or of more than about 2500 mJ/$m^2$, or of more than about 3000 mJ/$m^2$. For example, an FSG-FSG average bond energy at 1 second may be more than about 3500 mJ/$m^2$, and an average bond energy at 2 minutes of more than about 1300 mJ/$m^2$. In another example, a substrate with an FSG layer annealed at about 400° C. for about 1 hour, bonded to a substrate with an $SiO_2$ layer, may have an FSG-$SiO_2$ average bond energy at 1 second of more than about 4800 mJ/$m^2$, and an average bond energy at 2 minutes of more than about 2300 mJ/$m^2$.

Materials with strong cohesive energy (e.g., diamond, silicon carbide (SiC), or silicon nitride (SiN), materials with strong covalent bonds, materials that can withstand high temperatures, or materials with high melting point) may exhibit low interfacial bond energies in bonded substrates. The bonding energies of substrates comprising materials with strong cohesive energy may be improved by incorporating a dielectric layer (e.g., fluorine doped dielectric layer, a dielectric layer that is not doped with fluorine) on those substrates.

A fluorine-doped dielectric material may have a lower melting point than a dielectric material that is not doped with fluorine. Use of fluorine-doped dielectric layers in bonded substrates may produce higher bonding energy by using a fluorine-doped dielectric material with a lower melting point in comparison to a dielectric material that is not fluorine doped.

Accordingly, embodiments herein include a method of preparing a substrate for bonding by depositing a fluorine-doped dielectric layer on the substrate.

A fluorine-doped dielectric layer may be used for bonding. Delamination of bonded substrates with at least one fluorine-doped dielectric layer may occur due to moisture and/or unbonded fluorine desorption. The method of preparing a substrate for bonding may include annealing a substrate with a fluorine-doped dielectric layer before bonding. For example, an FSG layer annealed at about 400° C. for about 1 hour prior to bonding may have higher bonding energy over an FSG layer annealed at a lower temperature (e.g., about 300° C. for about 1 hour) or that is not annealed prior to bonding. The method of preparing a substrate for bonding may include depositing a fluorine-doped dielectric layer on the substrate with a concentration of fluorine less than 4%, such as less than about 3%. For example, an FSG layer having a concentration less than about 4% can reduce moisture absorption in the fluorine doped dielectric layer and may improve bond energy. An FSG layer with 5% or 6% or 7% concentration of fluorine may have more moisture absorption over an FSG layer with 4% concentration of fluorine. The moisture absorbed in the fluorine-doped dielectric layer may come from ambient environment and may depend on the amount of reactive fluorine existing in the layer. A lower concentration of fluorine (e.g., less than 4%) may improve bonding of substrates, as the amount of reactive fluorine existing in the fluorine-doped dielectric layer may be reduced with lower concentration of fluorine. The fluorine-doped dielectric layer may be exposed to hydrogen plasma to reduce or eliminate excess fluorine (e.g., causing excess fluorine to react to form HF). Eliminating excess fluorine may help prevent delamination of bonded substrates due to unbonded fluorine desorption.

As described below, semiconductor substrates herein generally have a "device side," e.g., the side on which semiconductor device elements are fabricated, such as transistors, resistors, and capacitors, and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that form the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal, e.g., after substrate thinning operations. Depending on the stage of device fabrication or assembly, the terms "active" and "non-active sides" may be used to describe surfaces of material layers or features formed on, in, or through the semiconductor substrate, whether or not the material layers or features are ultimately present in the fabricated or assembled device.

Spatially relative terms are used herein to describe the relationships between elements, such as the relationships between layers and other features described below. Unless the relationship is otherwise defined, terms such as "above," "over," "upper," "upwardly," "outwardly," "on," "below," "under," "beneath," "lower," and the like are generally made with reference to the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," either alone or in combination with a spatially relevant term include both relationships with intervening elements and direct relationships where there are no intervening elements.

Various embodiments disclosed herein relate to bonded structures in which two or more elements are directly bonded to one another without an intervening adhesive (referred to herein as "direct bonding", or "directly bonded"). In some embodiments, direct bonding can involve the bonding of a single material on the first of the two or more elements and a single material on a second one of the two more elements, where the single materials on the different elements may or may not be the same. Direct bonding can also involve bonding of multiple materials on one element to multiple materials on the other element (e.g., hybrid bonding). As used herein, the term "hybrid bonding" refers to a species of direct bonding in which both i) nonconductive features directly bond to nonconductive features, and ii) conductive features directly bond to conductive features.

The hybrid bonding methods described herein generally include forming conductive features in the dielectric surfaces of the to-be-bonded substrates, activating the surfaces to open chemical bonds in the dielectric material, and terminating the surfaces with a desired species. In some embodiments, activating the surface may weaken chemical bonds in the dielectric material. Activating and terminating the surfaces with a desired species may include exposing the surfaces to radical species formed in a plasma. In some embodiments, the plasma is formed using a nitrogen-containing gas, e.g., N2, or forming gas and the terminating species includes nitrogen and hydrogen. In some embodiments, the surfaces may be activated using a wet cleaning process, e.g., by exposing the surfaces to aqueous solutions. In some embodiments, the aqueous solution is tetramethylammonium hydroxide diluted to a certain degree or percentage. In some embodiments, an aqueous solution may be ammonia. In some embodiments, the plasma is formed using a fluorine-containing gas, e.g., fluorine gas or helium containing a small amount of fluorine and/or nitrogen such as about 10% or less by volume, 9% or less, 8% or less, 7% or less, 6% or less, 5% or less, 4% or less, 3% or less, 2% or less, for example 1% or less.

Typically, the hybrid bonding methods further include aligning the substrates, and contacting the activated surfaces to form direct dielectric bonds. After the dielectric bonds are formed, the substrates may be heated to a temperature between 50° C. to 150° C. or more, or of 150° C. or more and maintained at the elevated temperature for a duration of about 1 hour or more, such as between 8 and 24 hours, to form direct metallurgical bonds between the metal features.

As used herein, the term "substrate" means and includes any workpiece, wafer, panel, or article that provides a base material or supporting surface from which or upon which components, elements, devices, assemblies, modules, systems, or features of the devices described herein may be formed. The term substrate also includes "semiconductor substrates" that provide a supporting material upon which elements of a semiconductor device are fabricated or attached, and any material layers, features, electronic devices, and/or passive devices formed thereon, therein, or therethrough.

Figure 1B:
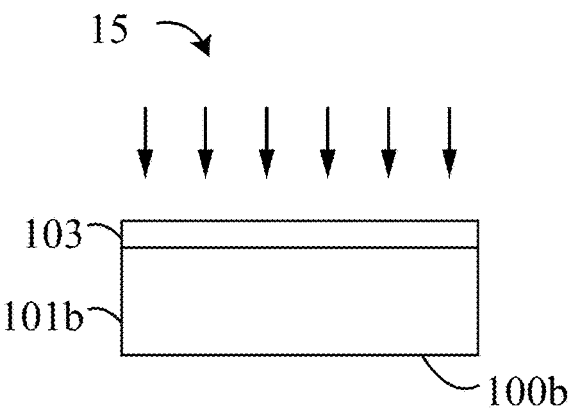
FIG. 1B schematically illustrates an aspect of a method of preparing a substrate with a dielectric layer for bonding, according to some embodiments.
Figure 1C:
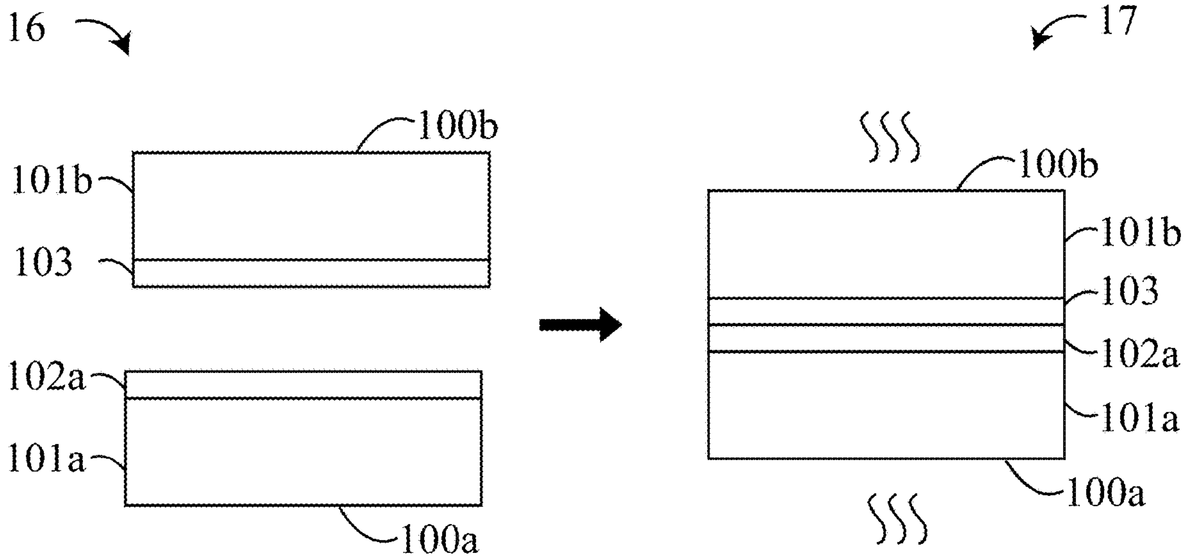
FIG. 1C schematically illustrates aspects of a method of bonding a substrate with a fluorine-doped dielectric layer and a substrate with a dielectric layer, according to some embodiments.

FIGS. 1A-1C collectively illustrate aspects of a direct bonding method, according to embodiments described herein. FIG. 1A illustrates a method of preparing a first substrate 100*a* with a fluorine-doped dielectric layer 102*a* for bonding, FIG. 1B illustrates a method of preparing a second substrate 100*b* with a dielectric layer 103 for bonding, and FIG. 1C illustrates directly bonding the first substrate 100*a* with the second substrate 100*b*.

Turning now to FIG. 1A, at block 10, the first substrate 100*a* comprises a base layer 101*a*. In some embodiments, the base layer 101*a* may comprise a material of strong covalent bonds (e.g., diamond, SiC, or SiN). In some embodiments, a dielectric layer may be deposited on the base layer 101*a* (e.g., base layer 101*c* with a dielectric layer 105 of FIG. 1D). In some embodiments, the base layer 101*a* may comprise a wafer (e.g., Si, glass substrate) with a dielectric layer (e.g., $SiO_2$). For example, the base layer 101*a* may comprise a dielectric layer that covers other structures (e.g., conductive layer, micro-electromechanical system (MEMs) devices). In some embodiments, the base layer may comprise a wafer with a polymer layer. For example, the base layer 101*a* may comprise a device package with a polymer layer on top (e.g., epoxy plastic, siloxane polyimide, silicones, etc.) or a polymer layer that covers other structures. In some embodiments, the method includes activating the first substrate 100*a* (e.g., base layer 101*a*). Activating a surface may comprise exposing a surface to a nitrogen-containing solution, a nitrogen-containing plasma, or some combination thereof to create dangling bonds on a surface. For example, activating a surface of the first substrate 100*a* may create dangling bonds on a surface of the first substrate 100*a*, which may improve adhesion of a fluorine-doped dielectric layer 102*a* to the first substrate 100*a*.

At block 11, the method includes depositing a fluorine-doped dielectric layer 102*a* on the first substrate 100*a* (e.g., base layer 101*a*). For example, the fluorine-doped dielectric layer 102*a* may deposited on an activated surface of the first substrate 100*a* (e.g., base layer 101*a*). A concentration of fluorine in the fluorine-doped dielectric layer of the first substrate may be less than about 4%. The fluorine-doped dielectric layer may be a fluorine-doped silicate glass (FSG) layer.

At block 12, the method includes activating the fluorine-doped dielectric layer 102*a*. For example, a surface of the fluorine-doped dielectric layer 102*a* may be exposed to a nitrogen-containing solution, a nitrogen-containing plasma, or some combination thereof to create dangling bonds on a surface of the fluorine-doped dielectric layer 102*a*.

At block 13, the method includes exposing the fluorine-doped dielectric layer 102*a* to a hydrogen-containing plasma to eliminate or reduce excess fluorine. For example, an activated surface of the fluorine-doped dielectric layer 102*a* may be exposed to hydrogen plasma at temperatures between about 150° C. to about 200° C. The method may include heating the first substrate 100*a* to a temperature between about 150° C. to about 200° C. The fluorine-doped dielectric layer 102*a* may comprise a substantially uniform concentration of fluorine.

At block 14, the method may or may not include polishing a surface of the fluorine-doped dielectric layer 102*a*. For example, the method may include polishing a surface of the fluorine-doped dielectric layer 102*a* after exposing the fluorine-doped dielectric layer 102*a* to a hydrogen-containing plasma at block 14. In other embodiments, the method includes polishing a surface of the fluorine-doped dielectric layer 102*a* after deposition of the fluorine-doped dielectric layer 102*a* in block 11, and not at block 14. In other embodiments, a surface of the fluorine-doped dielectric layer 102*a* may be polished after activation of a surface of the fluorine-doped dielectric layer 102*a* at block 12 and before exposing the fluorine-doped dielectric layer 102*a* to a hydrogen-containing plasma at block 13.

FIG. 1B schematically illustrates an aspect of a method of preparing a second substrate 100*b* with a dielectric layer 103 for bonding, according to some embodiments. At block 15, the second substrate 100*b* comprises a base layer 101*b* and a dielectric layer 103. In some embodiments, the base layer 101*b* may be substantially similar to the base layer 101*a* of FIG. 1A. In some embodiments, base layer 101*b* may comprise similar materials as base layer 101*a*. For example, base layer 101*a* and 101*b* may each comprise a material of strong covalent bond. In some embodiments, base layer 101*b* may comprise different materials as base layer 101*a*. For example, base layer 101*a* may comprise a dielectric layer covering other structures and base layer 101*b* may comprise a material of strong covalent bond.

The dielectric layer 103 is different than the fluorine-doped dielectric layer 102*a*. The dielectric layer 103 is not fluorine-doped. For example, the dielectric layer 103 may be an $SiO_2$ layer. The method includes activating a surface of the dielectric layer 103. For example, a surface of the dielectric layer 103 may be exposed to a nitrogen-containing solution, a nitrogen-containing plasma, or some combination thereof to create dangling bonds on a surface of the dielectric layer 103.

FIG. 1C schematically illustrates aspects of a method of directly bonding a first substrate 100*a* to a second substrate 100*b*, according to some embodiments. In some embodiments, a cleaned surface of a first substrate (100*a*) is bonded to an activated surface of a second substrate (100*b*).

At block 16, the method includes aligning the substrates to contact the substrates. In some embodiments, contacting the substrates is performed at ambient temperatures. Here, contacting the substrates forms a workpiece where first substrate 100*a* and second substrate 100*b* are attached to one another through direct bonds formed between the fluorine-doped dielectric layer 102*a* and the dielectric layer 103 without the use of an intervening adhesive.

At block 17, the method includes heating the workpiece to a processing temperature between about 50° C. to about 150° C. or more, or of about 150° C. or more, such as about 250° C. or more, or about 300° C. or more. In some embodiments, heating the workpiece is optional. For example, as will be described in relation to FIG. 3, a surface of the substrates may further comprise conductive features, and heating the workpiece may enable formation of direct interconnects by bonding the conductive features. For substrates without conductive features at a surface of the substrates, heating the workpiece may be optional.

Figure 1D:
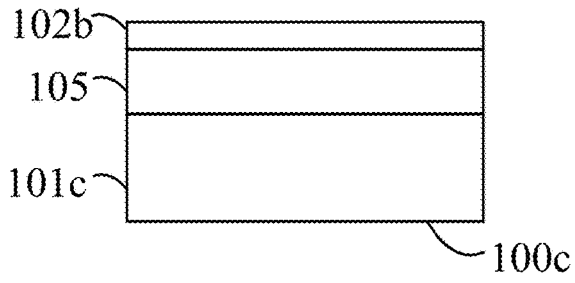
FIG. 1D schematically illustrates an example of a substrate with a dielectric layer and a fluorine-doped dielectric layer, according to some embodiments.

FIG. 1D schematically illustrates an example of a substrate 100*c* with a dielectric layer 105 and a fluorine-doped dielectric layer 102*b*, according to some embodiments. The substrate 100*c* comprises a base layer 101*c*, a dielectric layer 105, and a fluorine-doped dielectric layer 102*b*. The base layer 101*c* and fluorine-doped dielectric layer 102*b* may be substantially similar to base layer 101*a* and fluorine-doped dielectric layer 102*a* of FIG. 1A, except that there is a dielectric layer 105 between the base layer 101*c* and fluorine-doped dielectric layer 102*b*. The dielectric layer 105 is different than the fluorine-doped dielectric layer 102*b*. The dielectric layer 105 is not fluorine-doped.

In some embodiments, a thickness of the fluorine-doped dielectric layer 102*b* is thinner than a thickness of the dielectric layer 105. The thickness of the fluorine-doped dielectric layer 102*b* may be less than about 500 nm. The fluorine-doped dielectric layer 102*b* and the second dielectric layer 105 may comprise conductive layers.

A method may include depositing a dielectric layer 105 on a base layer 101*c*, and depositing a fluorine-doped dielectric layer 102*b* on the dielectric layer 105. In some embodiments, a base layer 101*c* may be activated prior to depositing the dielectric layer 105. In some embodiments, the dielectric layer 105 may be activated prior to depositing the fluorine-doped dielectric layer 102*b* on the dielectric layer 105. In some embodiments, the fluorine-doped dielectric layer 102*b* may undergo the processes described above in blocks 12 to 14 (e.g., as described in relation to fluorine-doped dielectric layer 102*a* of FIG. 1A). In other embodiments, the method includes polishing a surface of the fluorine-doped dielectric layer 102*b* after deposition of the fluorine-doped dielectric layer 102*b* (e.g., as described in block 11, and not at block 14 in relation to fluorine-doped dielectric layer 102*a* of FIG. 1A). In other embodiments, a surface of the fluorine-doped dielectric layer 102*b* may be polished after activation of a surface of the fluorine-doped dielectric layer 102*b* (e.g., as described at block 12 in relation to fluorine-doped dielectric layer 102*a* of FIG. 1A) and before exposing the fluorine-doped dielectric layer 102*b* to a hydrogen-containing plasma (e.g., as described at block 13 in relation to fluorine-doped dielectric layer 102*a* of FIG. 1A).

In some embodiments, the method may include directly bonding a substrate 100*c* to another substrate. In some embodiments, the other substrate may be substantially similar to substrate 100*b*. For example, instead of substrate 100*b* being bonded to substrate 100*a* as described in relation to blocks 16 and 17 of FIG. 1C, substrate 100*b* may be directly bonded to substrate 100*c* using a similar process.

In some embodiments, the method may include directly bonding a substrate 100*c* to another substrate that is substantially similar to substrate 200*b*. For example, instead of substrate 200*b* being bonded to substrate 200*a* as described below in relation to blocks 20 and 21 of FIG. 2C, substrate 200*b* may be directly bonded to substrate 100*c* using a similar process.

Figure 2A:
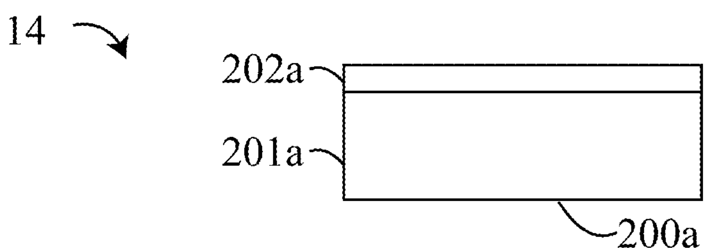
FIG. 2A schematically illustrates an aspect of a method of preparing a substrate with a fluorine-doped dielectric layer for bonding, according to some embodiments.
Figure 2B:
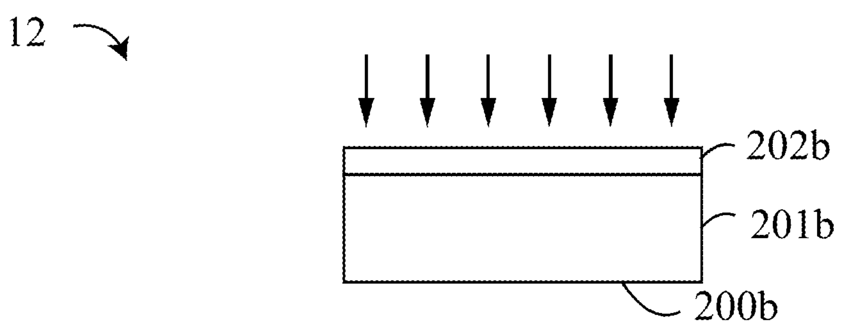
FIG. 2B schematically illustrates an aspect of a method of preparing a substrate with a fluorine-doped dielectric layer for bonding, according to some embodiments.
Figure 2C:
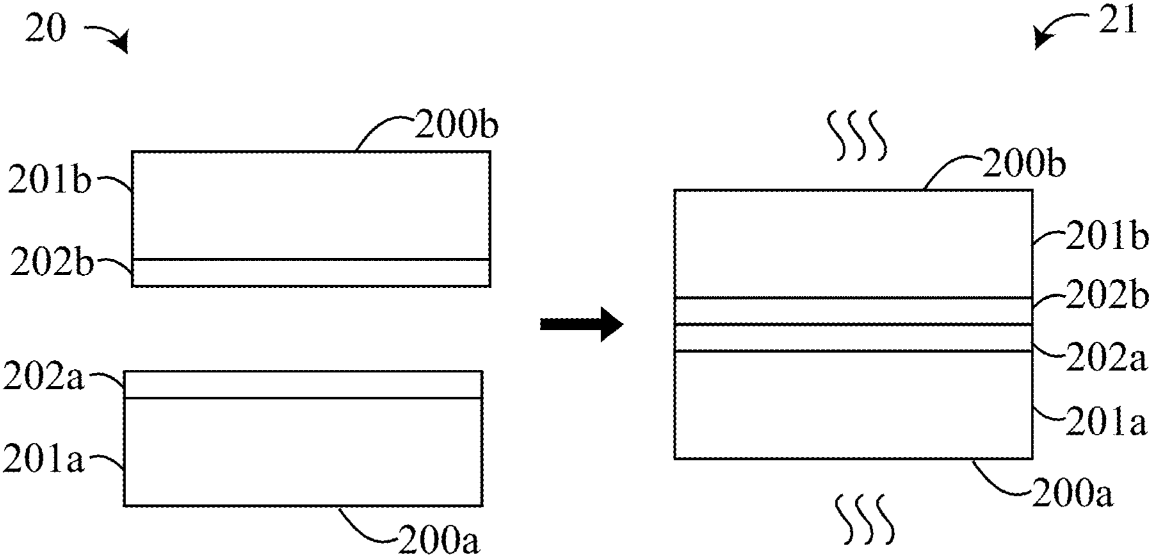
FIG. 2C schematically illustrates aspects of a method of bonding substrates, each substrate with a fluorine-doped dielectric layer, according to some embodiments.

In some embodiments, the method may include directly bonding a substrate 100*c* to another substrate comprising a fluorine-doped dielectric layer, a dielectric layer, and a base layer. In some embodiments, the other substrate may be activated prior to bonding to substrate 100*c* (e.g., as described in relation to fluorine-doped dielectric layer 102*a* to block 12 of FIG. 1A). In some embodiments, the other substrate may undergo the processes as described above in blocks 12 to 14 (e.g., as described in relation to fluorine-doped dielectric layer 102*a* of FIG. 1A). The bonding process may be similar to the bonding process described below in relation to FIG. 2C (e.g., as described in relation to bonding fluorine-doped dielectric layers of substrates). FIGS. 2A-2C collectively illustrate aspects of a direct bonding method. FIG. 2A illustrates a method of preparing a first substrate 200*a* with a fluorine-doped dielectric layer 202*a* for bonding, FIG. 2B illustrates a method of preparing a second substrate 200*b* with a fluorine-doped dielectric layer 202*b* for bonding, and FIG. 2C illustrates directly bonding the first substrate 200*a* with the second substrate 200*b*.

Referring now to FIG. 2A, at block 14, the first substrate 200*a* generally includes a fluorine-doped dielectric layer 202*a* and a base layer 201*a*. The first substrate 200*a* is substantially similar to the first substrate 100*a* at block 14 in FIG. 1A.

FIG. 2B schematically illustrates an aspect of a method of preparing a second substrate 200*b* with a fluorine-doped dielectric layer 202*b* for bonding, according to some embodiments. The second substrate 200*b* comprises a base layer 201*b* and a fluorine-doped dielectric layer 202*b*. The second substrate 200*b* is substantially similar to the first substrate 100*b* at block 12 in FIG. 1A. The method includes activating a surface of the fluorine-doped dielectric layer 202*b*. For example, a surface of the fluorine-doped dielectric layer 202*b* may be exposed to a nitrogen-containing solution, a nitrogen-containing plasma, or some combination thereof to create dangling bonds on a surface of the fluorine-doped dielectric layer 202*b*. In other embodiments, the second substrate 200*b* may be substantially similar to the first substrate 100*a* at block 14 in FIG. 1A. For example, the second substrate 200*b* may undergo the processes as described above in blocks 12 to 14 of FIG. 1A.

FIG. 2C schematically illustrates aspects of a method of directly bonding a first substrate 200*a* to a second substrate 200*b*, according to some embodiments. In some embodiments, a cleaned surface of a first substrate (200*a*) is bonded to an activated surface of a second substrate (200*b*).

At block 20, the method includes aligning the substrates to contact the substrates. In some embodiments, contacting the substrates is performed at ambient temperatures. Here, contacting the substrates forms a workpiece where first substrate 200*a* and second substrate 200*b* are attached to one another through direct bonds formed between the fluorine-doped dielectric layer 202*a* and the fluorine-doped dielectric layer 202*b* without the use of an intervening adhesive.

At block 21, the method includes heating the workpiece to a processing temperature of between about 50° C. to about 150° C. or more, or of about 150° C. or more, such as about 300° C. or more. In some embodiments, heating the workpiece is optional. For example, as will be described in relation to FIG. 4, a surface of the substrates may further comprise conductive features, and heating the workpiece may enable formation of direct interconnects by bonding the conductive features. For substrates without conductive features at a surface of the substrates, heating the workpiece may be optional.

Figure 3A:
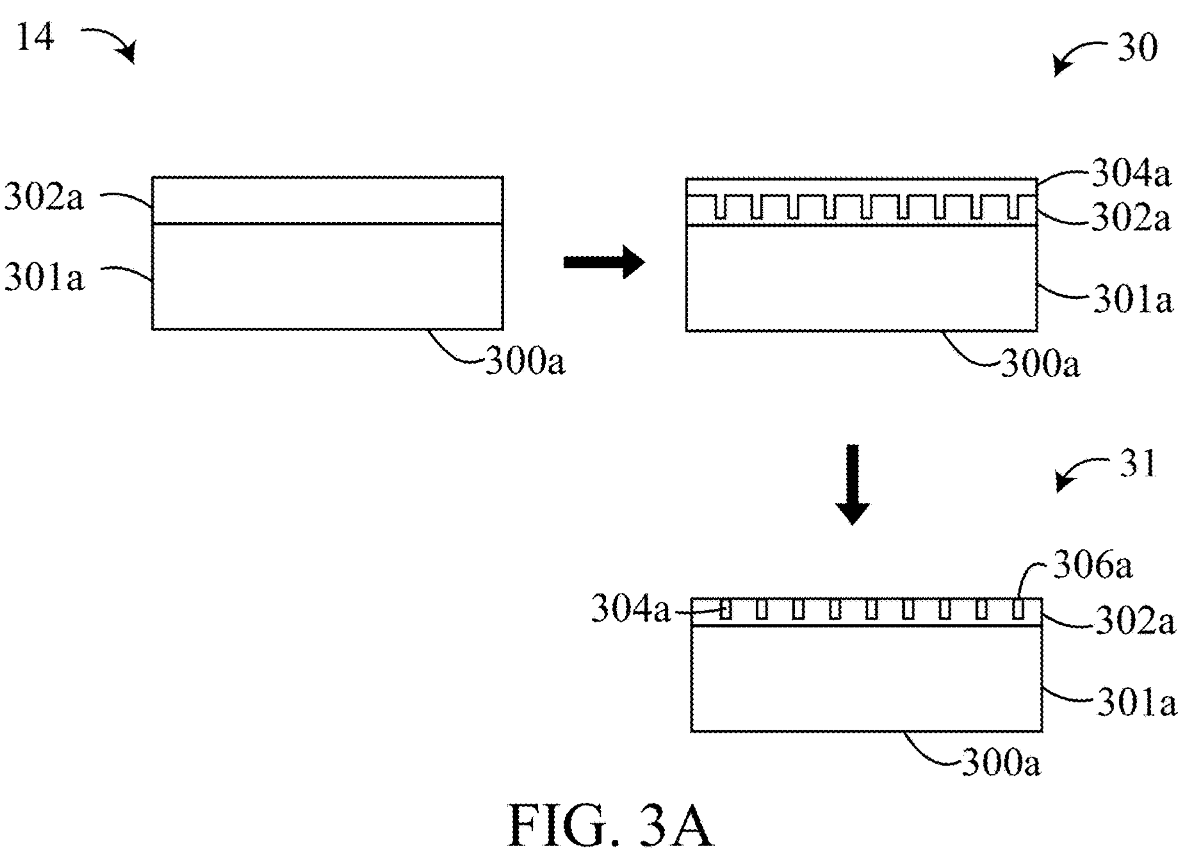
FIG. 3A schematically illustrates aspects of a method of preparing a substrate with conductive features disposed in a fluorine-doped dielectric layer for hybrid bonding, according to some embodiments.
Figure 3B:
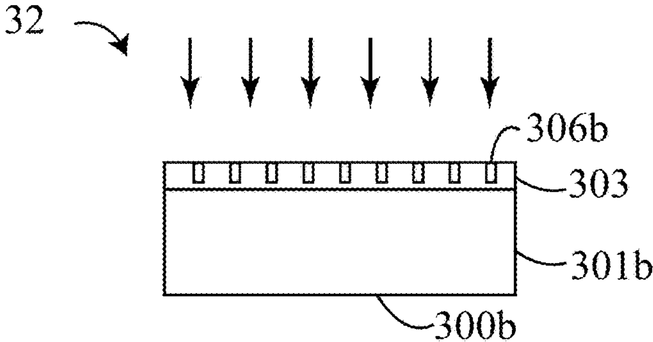
FIG. 3B schematically illustrates an aspect of preparing a substrate with conductive features disposed in a dielectric layer for hybrid bonding, according to some embodiments.
Figure 3C:
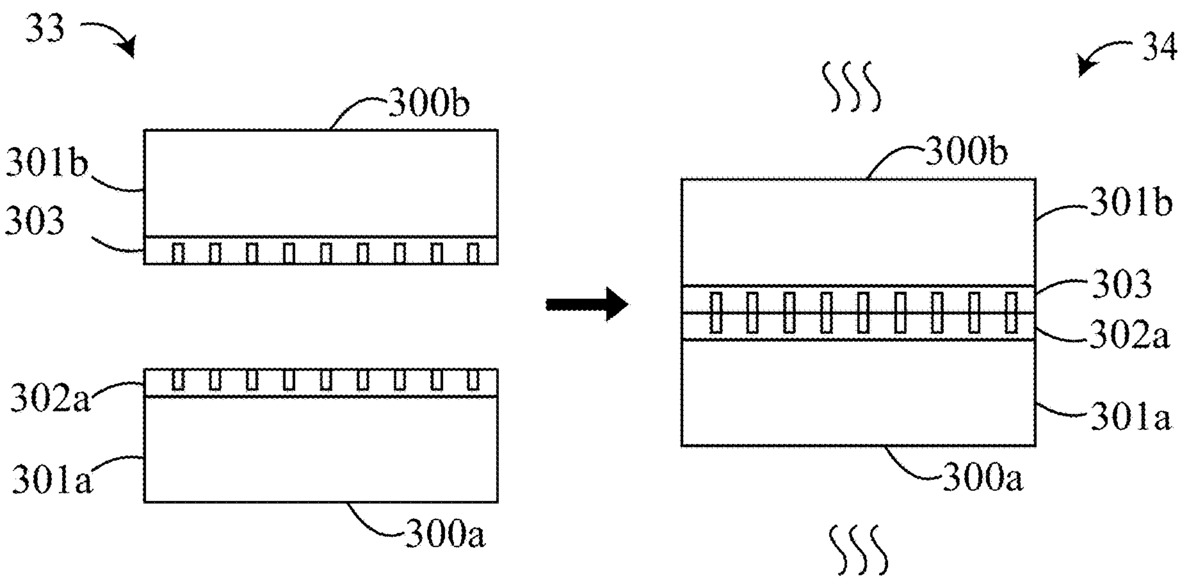
FIG. 3C schematically illustrates aspects of a method of hybrid bonding a substrate with conductive features disposed in a fluorine-doped dielectric layer and a substrate with conductive features disposed in a dielectric layer, according to some embodiments.

FIGS. 3A-3C collectively illustrate aspects of a hybrid bonding method. FIG. 3A illustrates a method of preparing a first substrate 300*a* with first conductive features 306*a* disposed in a fluorine-doped dielectric layer 302*a* for hybrid bonding, FIG. 3B illustrates a method of preparing a second substrate 300*b* with a second conductive features 306*b* disposed in a dielectric layer 303 for hybrid bonding, and FIG. 3C illustrates hybrid bonding the first substrate 300*a* with the second substrate 300*b*.

FIG. 3A schematically illustrates aspects of a method of preparing a first substrate 300*a* with conductive features 306*a* disposed in a fluorine-doped dielectric layer 302*a* for hybrid bonding, according to some embodiments.

At block 14, the first substrate 300*a* generally includes a fluorine-doped dielectric layer 302*a* and a base layer 301*a*. The first substrate 300*a* is substantially similar to the first substrate 100*a* at block 14 in FIG. 1A.

At block 30, the method includes depositing a conductive layer 304*a* in openings in a fluorine-doped dielectric layer 302*a*. The openings in the fluorine-doped dielectric layer 302*a* may be formed by patterning the fluorine-doped dielectric layer 302*a*. In some embodiments, a barrier layer is formed in the openings in the fluorine-doped dielectric layer 302*a* prior to depositing a conductive layer 304*a*. For example, the barrier layer may comprise a compound material such as titanium nitride material, tantalum nitride material, or a combination thereof. The barrier layer may separate the conductive layer 304*a* from the fluorine-doped dielectric layer 302*a* to prevent metal fluoride formation. Avoiding formation of metal fluoride may be desirable because metal fluoride may be brittle and, for example, may cause a side wall of a conductive features to break or buckle. For example, if the conductive layer 304*a* comprises a tantalum material, placement of the tantalum material next to a fluorine-doped dielectric layer 302*a* may result in formation of tantalum fluoride. Using a compound material such as tantalum nitride to separate the tantalum material from the fluorine-doped dielectric layer may prevent formation of tantalum fluoride. As an example, the conductive layer 304*a* may comprise a titanium, tantalum, or copper material.

At block 31, the method includes polishing the conductive layer 304*a* to remove an overburden of the conductive layer 304*a* and form conductive features 306*a*. For example, the conductive layer 304*a* may be polished using a CMP process.

FIG. 3B schematically illustrates an aspect of preparing a second substrate 300*b* with conductive features 306*b* disposed in a dielectric layer 303 for hybrid bonding, according to some embodiments. At block 32, the second substrate 300*b* comprises a base layer 301*b*, a dielectric layer 303, and conductive features 306*b* disposed in the dielectric layer 303. The base layer 301*b* and the dielectric layer 303 may be substantially similar to base layer 101*a* and the dielectric layer 103 of FIG. 1A. The conductive features 306*b* may be substantially similar to conductive features 306*a* of FIG. 3A, except the conductive features 306*b* are disposed in a dielectric layer 303 and not a fluorine-doped dielectric layer 302*a* of FIG. 3A. The dielectric layer 303 is not fluorine-doped. The method includes activating a surface of the dielectric layer 303 and the conductive features 306*b*. For example, a surface of the dielectric layer 303 and the conductive features 306*b* may be exposed to a nitrogen-containing solution, a nitrogen-containing plasma, or some combination thereof to create dangling bonds on a surface of the dielectric layer 103.

FIG. 3C schematically illustrates aspects of a method of hybrid bonding a first substrate 300*a* with a second substrate 300*b*, according to some embodiments. In some embodiments, a cleaned surface of a first substrate 300*a* is bonded to an activated surface of a second substrate (300*b*). In some embodiments, the first substrate 300*a* may be activated prior to bonding. For example, the first substrate 300*a* may undergo processes similar to block 12 at FIG. 1A. In some embodiments, the first substrate 300*a* may undergo processes similar to block 12 and 13 of FIG. 1A prior to bonding.

At block 33, the method includes aligning the respective conductive features (e.g., conductive features 306*a* and 306*b*) to contact the substrates. In some embodiments, contacting the substrates is performed at ambient temperatures. Here, contacting the substrates forms a workpiece where first substrate 300*a* and second substrate 300*b* are attached to one another through direct bonds formed between the fluorine-doped dielectric layer 302*a* and the dielectric layer 303 without the use of an intervening adhesive.

At block 34, the method includes heating the workpiece to a processing temperature between about 50° C. to about 150° C. or more, or of about 150° C. or more, such as about 300° C. or more. For example, heating the workpiece may enable formation of direct interconnects by bonding the conductive features 306*a* and 306*b* without the use of an intervening adhesive.

Figure 3D:
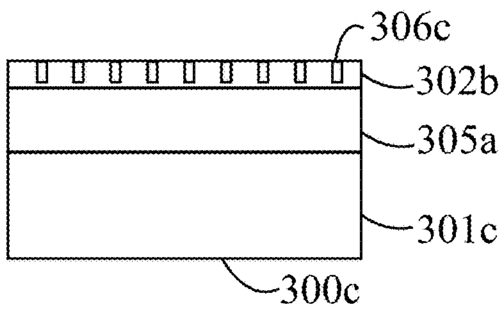
FIG. 3D schematically illustrates an example of a substrate with conductive features disposed in a fluorine-doped dielectric layer on a dielectric layer, according to some embodiments.

FIG. 3D schematically illustrates an example of a substrate 300*c* with conductive features 306*c* disposed in a fluorine-doped dielectric layer 302*b* on a dielectric layer 305*a*, according to some embodiments. The substrate 300*c* comprises a base layer 301*c*, a dielectric layer 305*a*, a fluorine-doped dielectric layer 302*b*, and conductive features 306*c* disposed in the fluorine-doped dielectric layer 302*b*. For example, a substrate similar to substrate 100*c* of FIG. 1D may be used instead of the substrate 300*a* at block 14, and undergo similar processes as described in relation to blocks 30-31 of FIG. 3A, to form conductive features 306*c* disposed in the fluorine-doped dielectric layer 302*b* of substrate 300*c*.

In some embodiments, the method may include directly bonding a substrate 300*c* to another substrate. In some embodiments, the other substrate may be substantially similar to substrate 300*b*. For example, instead of substrate 300*b* being bonded to substrate 300*a* as described in relation to blocks 33 and 34 of FIG. 3C, substrate 300*b* may be directly bonded to substrate 300*c* using a similar process.

In some embodiments, the other substrate that substrate 300*c* is directly bonded to comprises conductive features disposed in a fluorine-doped dielectric layer on a dielectric layer on a base layer. In some embodiments, the other substrate may be activated prior to bonding to substrate 300*c*. In some embodiments, the other substrate may be substantially similar to substrate 300*c*. The bonding process may be similar to the bonding process as described below in relation to FIG. 4C (e.g., for conductive features disposed in a fluorine-doped dielectric layers).

Figure 3E:
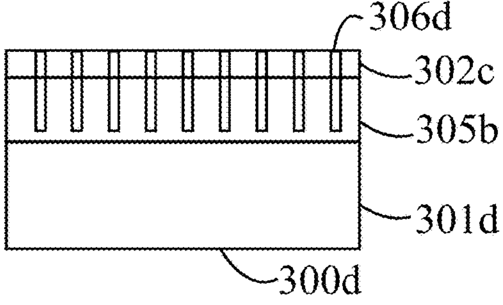
FIG. 3E schematically illustrates an example of a substrate with conductive features disposed in a dielectric layer and a fluorine-doped dielectric layer, according to some embodiments.

FIG. 3E schematically illustrates an example of a substrate 300*d* with conductive features 306*d* disposed in a dielectric layer 305*b* and a fluorine-doped dielectric layer 302*c*, according to some embodiments. The substrate 300*d* comprises a base layer 301*d*, a dielectric layer 305*b*, a fluorine-doped dielectric layer 302*c*, and conductive features 306*d* disposed in the fluorine-doped dielectric layer 302*c* and the dielectric layer 305*b*. For example, instead of the substrate 300*a* of block 14, the substrate 100*c* of FIG. 1D may undergo similar processes as described in relation to blocks 30-31 of FIG. 3A (except openings are in the fluorine-doped dielectric layer 302*c* and the dielectric layer 305*b*), to form conductive features 306*d* in the fluorine-doped dielectric layer 302*c* and the dielectric layer 305*b* of substrate 300*d*.

In some embodiments, the method may include directly bonding a substrate 300*d* to another substrate. In some embodiments, the other substrate may be substantially similar to substrate 300*b*. For example, instead of substrate 300*b* being bonded to substrate 300*a* as described in relation to blocks 33 and 34 of FIG. 3C, substrate 300*b* may be directly bonded to substrate 300*d* using a similar process.

In some embodiments, the other substrate that substrate 300*d* is directly bonded to comprises conductive features disposed in a fluorine-doped dielectric layer and in a dielectric layer, on a base layer. In some embodiments, the other substrate may be activated prior to bonding to substrate 300*d* (e.g., as described in relation to block 32). In some embodiments, the other substrate may be substantially similar to substrate 300*d*. The bonding process may be similar to the bonding process described below in relation to FIG. 4C (e.g., for conductive features disposed in a fluorine-doped dielectric layers).

Figure 4A:
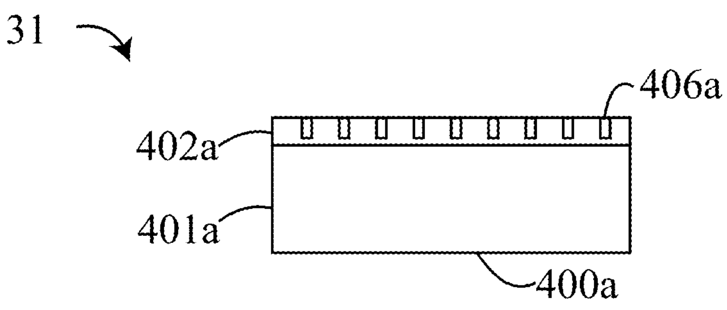
FIG. 4A schematically illustrates an aspect of a method of preparing a substrate with conductive features disposed in a fluorine-doped dielectric layer for hybrid bonding, according to some embodiments.
Figure 4B:
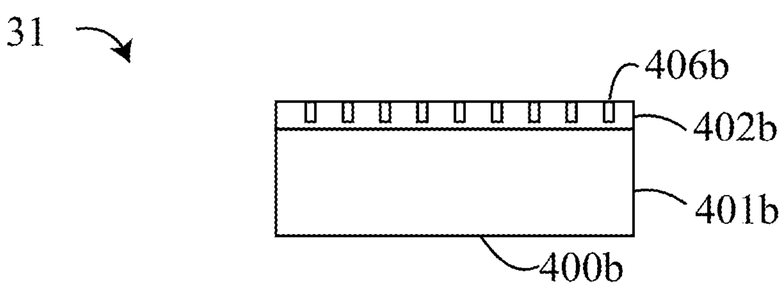
FIG. 4B schematically illustrates an aspect of preparing a substrate with conductive features disposed in a fluorine-doped dielectric layer for hybrid bonding, according to some embodiments.
Figure 4C:
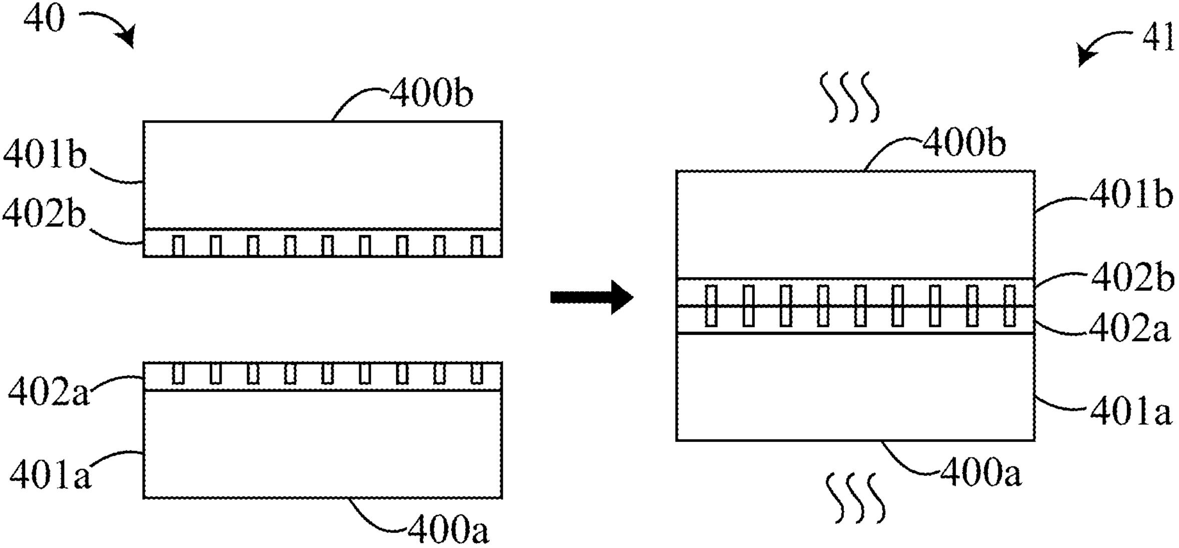
FIG. 4C schematically illustrates aspects of a method of hybrid bonding substrates each with conductive features disposed in a fluorine-doped dielectric layer, according to some embodiments.

FIGS. 4A-4C collectively illustrate aspects of a hybrid bonding method. FIG. 4A illustrates a method of preparing a first substrate 400*a* with first conductive features 406*a* disposed in a first fluorine-doped dielectric layer 402*a* for hybrid bonding, FIG. 4B illustrates a method of preparing a second substrate 400*b* with a second conductive features 406*b* disposed in a second fluorine-doped dielectric layer 402*b* for hybrid bonding, and FIG. 4C illustrates hybrid bonding the first substrate 400*a* with the second substrate 400*b*.

FIG. 4A schematically illustrates an aspect of a method of preparing a substrate 400*a* with conductive features 406*a* disposed in a fluorine-doped dielectric layer 402*a* for hybrid bonding, according to some embodiments.

At block 31, the first substrate 400*a* comprises a base layer 401*a*, a fluorine-doped dielectric layer 402*a* with conductive features 406*a* disposed in the fluorine-doped dielectric layer 402*a*. The first substrate 400*a* is substantially similar to the first substrate 300*a* at block 31 in FIG. 3A.

FIG. 4B schematically illustrates an aspect of preparing a substrate 400*b* with conductive features 406*b* disposed in a fluorine-doped dielectric layer 402*b* for hybrid bonding, according to some embodiments.

At block 31, the second substrate 400*b* comprises a base layer 401*b*, a fluorine-doped dielectric layer 402*b* with conductive features 406*b* disposed in the fluorine-doped dielectric layer 402*b*. The first substrate 400*b* is substantially similar to the first substrate 300*a* at block 31 in FIG. 3A.

FIG. 4C schematically illustrates aspects of a method of hybrid bonding substrates each with conductive features disposed in a fluorine-doped dielectric layer, according to some embodiments. In some embodiments, a cleaned surface of a first substrate 400*a* is bonded to an activated surface of a second substrate 400*b*. In some embodiments, the first substrate 400*a* and/or second substrate 400*b* may be activated prior to bonding. For example, the first substrate 400*a* and/or second substrate 400*b* may undergo processes similar to block 12 at FIG. 1A. In some embodiments, the first substrate 400*a* and/or second substrate 400*b* may undergo processes similar to block 12 and 13 of FIG. 1A prior to bonding, except that instead of a fluorine-doped dielectric layer, the substrate includes conductive features disposed in a fluorine-doped dielectric layer.

At block 40, the method includes aligning the respective conductive features (e.g., conductive features 406*a* and 406*b*) to contact the substrates. In some embodiments, contacting the substrates is performed at ambient temperatures. Here, contacting the substrates forms a workpiece where first substrate 400*a* and second substrate 400*b* are attached to one another through direct bonds formed between the fluorine-doped dielectric layer 402*a* and the fluorine-doped dielectric layer 402*b* without the use of an intervening adhesive.

At block 41, the method includes heating the workpiece to a processing temperature between about 50° C. to about 150° C. or more, or of about 150° C. or more, such as about 300° C. or more. For example, heating the workpiece may enable formation of direct interconnects by bonding the conductive features 406*a* and 406*b* without the use of an intervening adhesive.

Figure 5A:
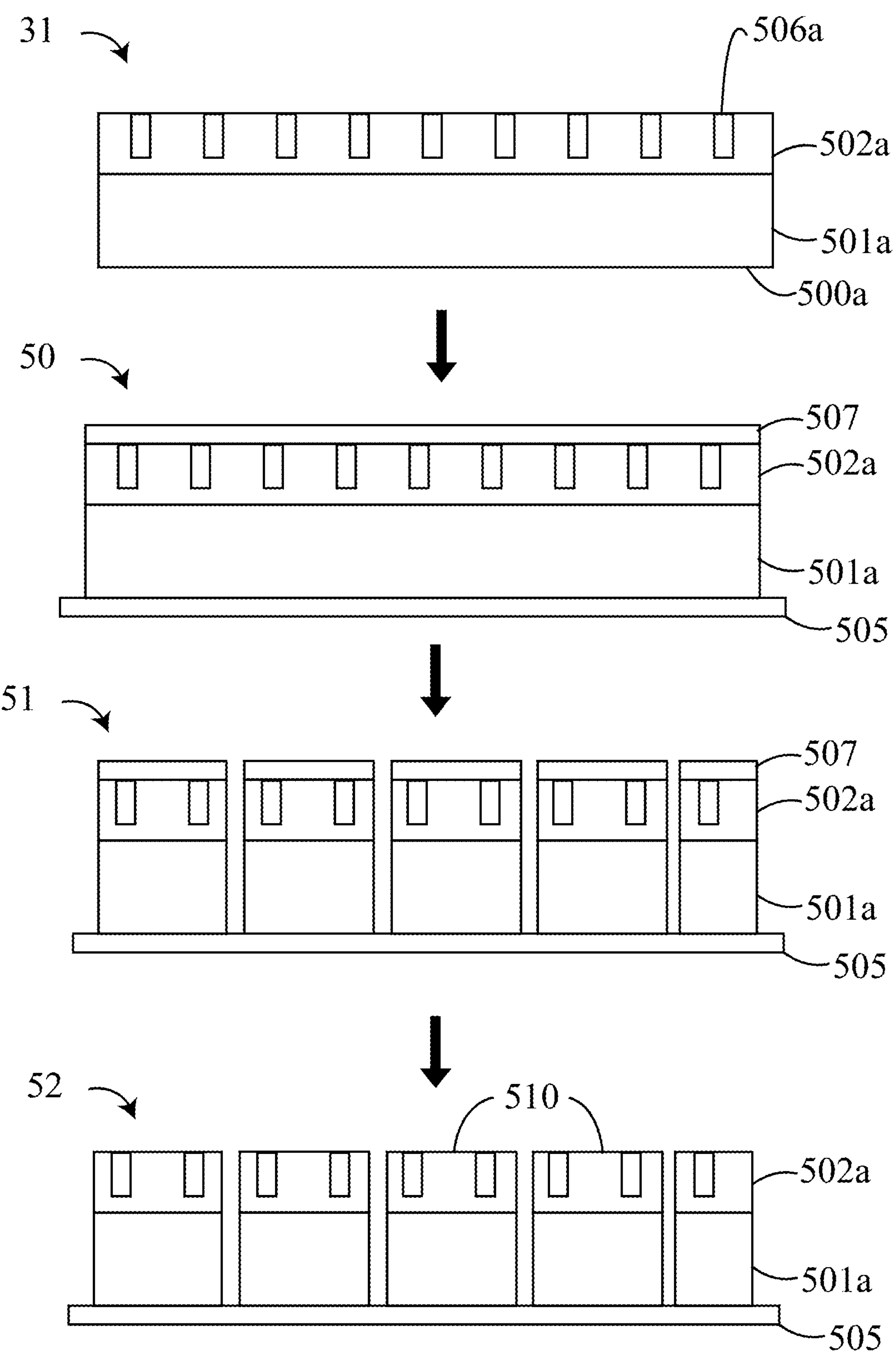
FIG. 5A schematically illustrates aspects of a method of singulating a substrate with conductive features disposed in a fluorine-doped dielectric layer for hybrid bonding, according to some embodiments.

FIG. 5A schematically illustrates aspects of a method of singulating a substrate 500*a* with conductive features 506*a* disposed in a fluorine-doped dielectric layer 502*a* for hybrid bonding, according to some embodiments. In some other embodiments, the method may comprise singulating a substrate with conductive features disposed in a dielectric layer that is not fluorine-doped for hybrid bonding. In some other embodiments, the method may be applied to singulating a substrate with a fluorine-doped dielectric layer without conductive features for direct bonding. In some other embodiments, the method may be applied to singulating a substrate with a dielectric layer without conductive features for direct bonding.

At block 31, the substrate 500*a* comprises a base layer 501*a*, a fluorine-doped dielectric layer 502*a*, and conductive features 506*a* disposed in the fluorine-doped dielectric layer 502*a*. The substrate 500*a* is substantially similar to the substrate 300*a* at block 31 in FIG. 3A.

At block 50, the method comprises attaching the substrate 500*a* to a temporary carrier 505. The method comprises coating a protective layer 507 on a surface of the fluorine-doped dielectric layer 502*a* and the conductive features 506*a* (e.g., surface of substrate 500*a*).

At block 51, the method comprises singulating the protective layer 507 and the fluorine-doped dielectric layer 502*a* and conductive features 506*a* on the base layer 501*a*.

At block 52, the method comprises stripping the protective layer and cleaning the substrate 500*a*. Singulated dies 510 each comprise a base layer 501*a*, fluorine-doped dielectric layer 502*a*, and conductive features 506*a* disposed in the fluorine-doped dielectric layer 502*a*.

Figure 5B:
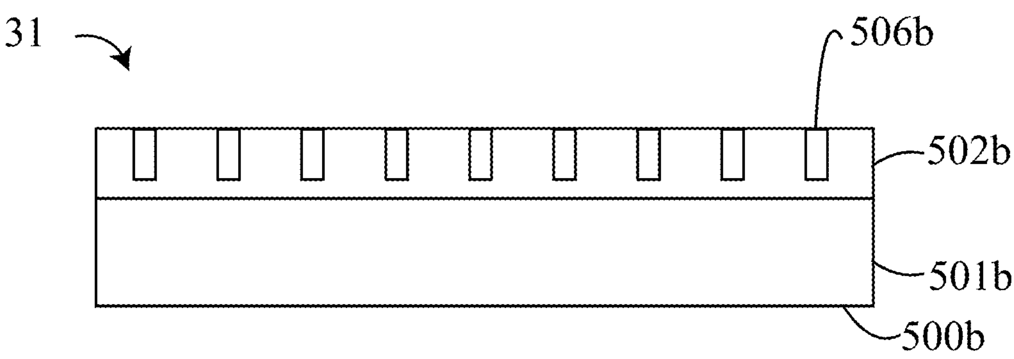
FIG. 5B schematically illustrates an aspect of a method of preparing a substrate with conductive features disposed in a fluorine-doped dielectric layer for hybrid bonding, according to some embodiments.

FIG. 5B schematically illustrates an aspect of a method of preparing a substrate 500*b* with conductive features 506*b* disposed in a fluorine-doped dielectric layer 502*b* for hybrid bonding, according to some embodiments.

At block 31, the substrate 500*b* comprises a base layer 501*b*, a fluorine-doped dielectric layer 502*b*, and conductive features 506*b* disposed in the fluorine-doped dielectric layer 502*b*. The substrate 500*b* is substantially similar to the substrate 300*a* at block 31 in FIG. 3A.

Figure 5C:
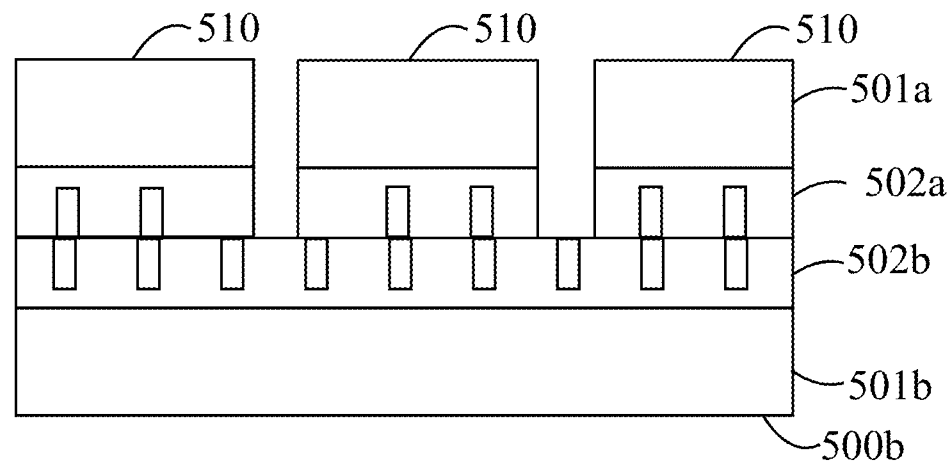
FIG. 5C schematically illustrates an example of hybrid bonded singulated dies to a substrate to form a workpiece, according to some embodiments.

FIG. 5C schematically illustrates an example of hybrid bonded singulated dies 510 to a substrate 500*b* to form a workpiece, according to some embodiments. The singulated dies 510 at block 52 of FIG. 5A may be removed from temporary carrier 505 before or after bonding. The singulated dies 510 and the second substrate 500*b* may be aligned, contacted, and heated to form direct interconnects via hybrid bonding, such as described above in relation to FIG. 4C.

Figure 5D:
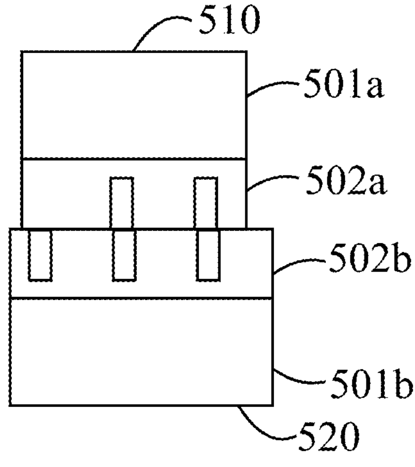
FIG. 5D schematically illustrates an example of a singulated workpiece, according to some embodiments.

FIG. 5D schematically illustrates an example of a singulated workpiece 520, according to some embodiments. For example, the workpiece of FIG. 5C may be singulated (e.g., the substrate 500*b* may be singulated).

In some embodiments, the substrate 500*b* in FIG. 5B may be substantially similar to substrate 300*b* in FIG. 3B. For example, the conductive features 506*b* may be disposed in a dielectric layer (e.g., dielectric layer 303) instead of a fluorine-doped dielectric layer 502*b*, and the singulated dies 510 in FIG. 5C may be hybrid bonded to a substrate that is similar to the substrate 300*b* in FIG. 3C.

In some embodiments, the singulated dies 510 in FIG. 5C may comprise conductive features 506*b* disposed in a dielectric layer (e.g., dielectric layer 303 in FIG. 3B). For example, instead of singulating a substrate 500*a* in FIG. 5A, a substrate substantially similar to substrate 300*b* of FIG. 3B may be singulated. The singulated dies 510 may comprise conductive features 506*b* disposed in a dielectric layer that may be hybrid bonded to the substrate 500*b*.

Figure 6A:
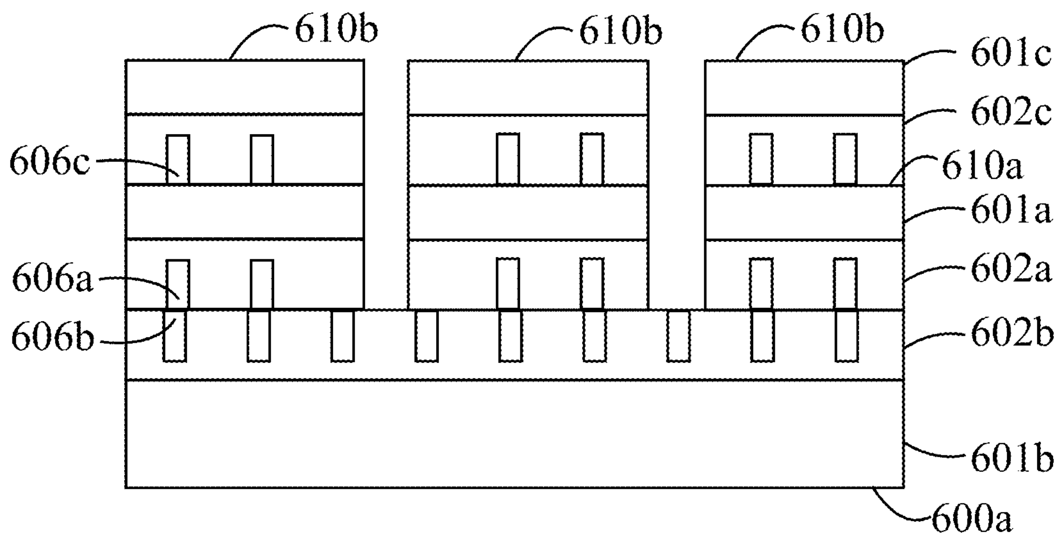
FIG. 6A schematically illustrates an example of bonded stacked singulated dies to a substrate to form a workpiece, according to some embodiments.

FIG. 6A schematically illustrates an example of bonding stacked singulated dies 610*a* and 610*b* to a substrate 600*a* to form a workpiece, according to some embodiments. The workpiece comprises a plurality of first singulated dies 610*a* hybrid bonded to a substrate 600*a*. The first singulated dies 610*a* each comprise a base layer 601*a*, a fluorine-doped dielectric layer 602*a*, and conductive features 606*a* disposed in the fluorine-doped dielectric layer 602*a*. The substrate 600*a* comprises a base layer 601*b*, a fluorine-doped dielectric layer 602*b*, and conductive features 606*b* disposed in the fluorine-doped dielectric layer 602*b*. The first singulated dies 610*a* and the substrate 600*a* may be substantially similar to the hybrid bonded singulated dies 510 and substrate 500*b* of FIG. 5C. The second singulated dies 610*b* each comprise a base layer 601*c*, a fluorine-doped dielectric layer 602*c*, and conductive features 606*c* disposed in the fluorine-doped dielectric layer 602*c*. The second singulated dies 610*b* may be substantially similar to the singulated dies 510 of FIG. 5A after being removed from temporary substrate 505. The second singulated dies 610*b* may be bonded to the first singulated dies 610*a*.

Figure 6B:
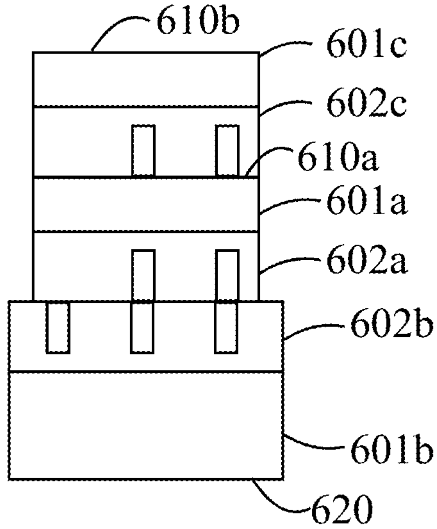
FIG. 6B schematically illustrates an example of a singulated workpiece, according to some embodiments.

FIG. 6B schematically illustrates an example of a singulated workpiece 620, according to some embodiments. For example, the workpiece of FIG. 6A may be singulated (e.g., the substrate 600*a* may be singulated). In some embodiments, at least one bonding surface of the first singulated dies 610*a*, the second singulated dies 610*b*, and the singulated substrate 600*a* may comprise dielectric layer that is not fluorine-doped. For example, at least one, such as one or two of the fluorine-doped dielectric layers 602*a*, 602*b*, and 602*c* may be replaced with a dielectric layer (e.g., dielectric layer 303 of FIG. 3B) that is not doped with fluorine.

Figure 7A:
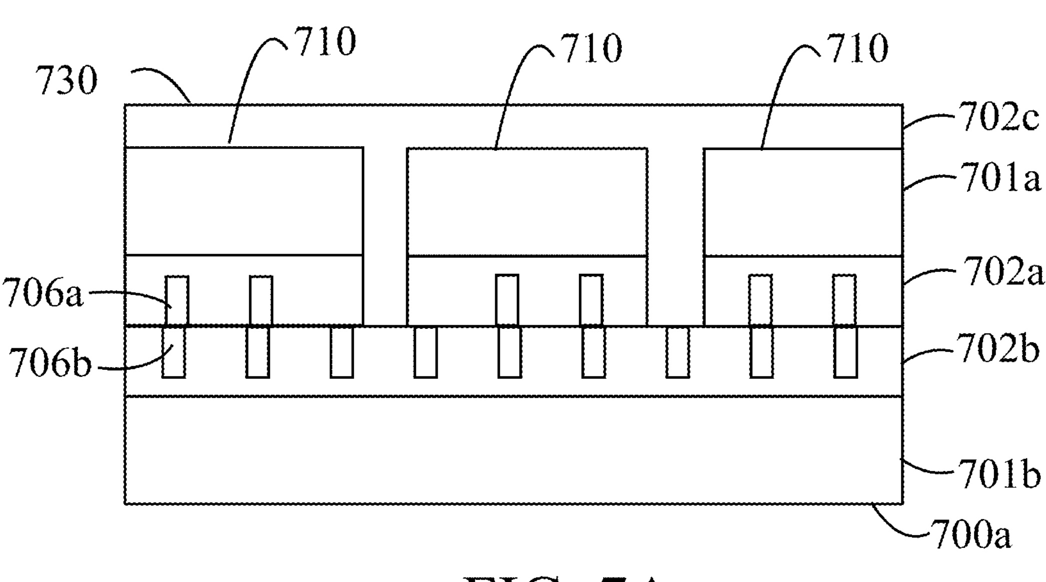
FIG. 7A schematically illustrates a reconstituted substrate with at least a portion of a fluorine-doped dielectric layer between dies, according to some embodiments.

FIG. 7A schematically illustrates a reconstituted substrate 730 with at least a portion of a fluorine-doped dielectric layer 702*c* between singulated dies 710, according to some embodiments. The singulated dies 710 each comprise a base layer 701*a*, a fluorine-doped dielectric layer 702*a*, and conductive features 706*a* disposed in the fluorine-doped dielectric layer 702*a*. The substrate 700*a* comprises a base layer 701*b*, a fluorine-doped dielectric layer 702*b*, and conductive features 706*b* disposed in the fluorine-doped dielectric layer 702*b*. The singulated dies 710 and the substrate 700*a* may be substantially similar to the hybrid bonded singulated dies 510 and substrate 500*b* of FIG. 5C. In some embodiments, the singulated dies 710 may be attached in any suitable manner to the substrate 700*a* (e.g., direct bonding, hybrid bonding, bonding with an adhesive). A method of preparing the reconstituted substrate 730 may comprise depositing a fluorine-doped dielectric layer 702*c* on the singulated dies 710 and the substrate 700*a*, and polishing the fluorine-doped dielectric layer 702*c*. The fluorine-doped dielectric layer 702*c* may comprise FSG. The reconstituted substrate 730 may be prepared for bonding using similar processes as described above in relation to substrate 100*a* in blocks 12-14 of FIG. 1A. In some embodiments, polishing the fluorine-doped dielectric layer 702*c* may occur before or after activating the surface of the fluorine-doped dielectric layer 702*c*. In some embodiments, polishing the fluorine-doped dielectric layer 702*c* may occur before or after exposing the fluorine-doped dielectric layer 702*c* to hydrogen-containing plasma.

In some other embodiments, the method may comprise forming conductive features disposed in the fluorine-doped dielectric layer 702*c*. For example, the conductive features may be formed on substrate 730 using processes as described above in blocks 30-31 in relation to substrate 300*a* of FIG. 3A. The conductive features may be formed to electrically connect to a device (e.g., electrodes of a device, input/outputs) of each singulated die 710.

In other embodiments, conductive features may be formed from existing conductive structures (e.g., vias or interconnects) or a conductive layer of each singulated die. For example, the method may include exposing a top portion of conductive structures (e.g., within a dielectric layer) of each singulated die, or patterning a conductive layer in each singulated die, depositing a fluorine-doped dielectric layer on the exposed top portion of the conductive structures or patterned conductive layer, and polishing the fluorine-doped dielectric layer. Prior to depositing a fluorine-doped dielectric layer, a barrier layer (e.g., as described above in relation to block 30 in FIG. 3A) may be deposited to separate the fluorine-doped dielectric layer from the conductive structure or patterned conductive layer to prevent metal fluoride formation.

Figure 7B:
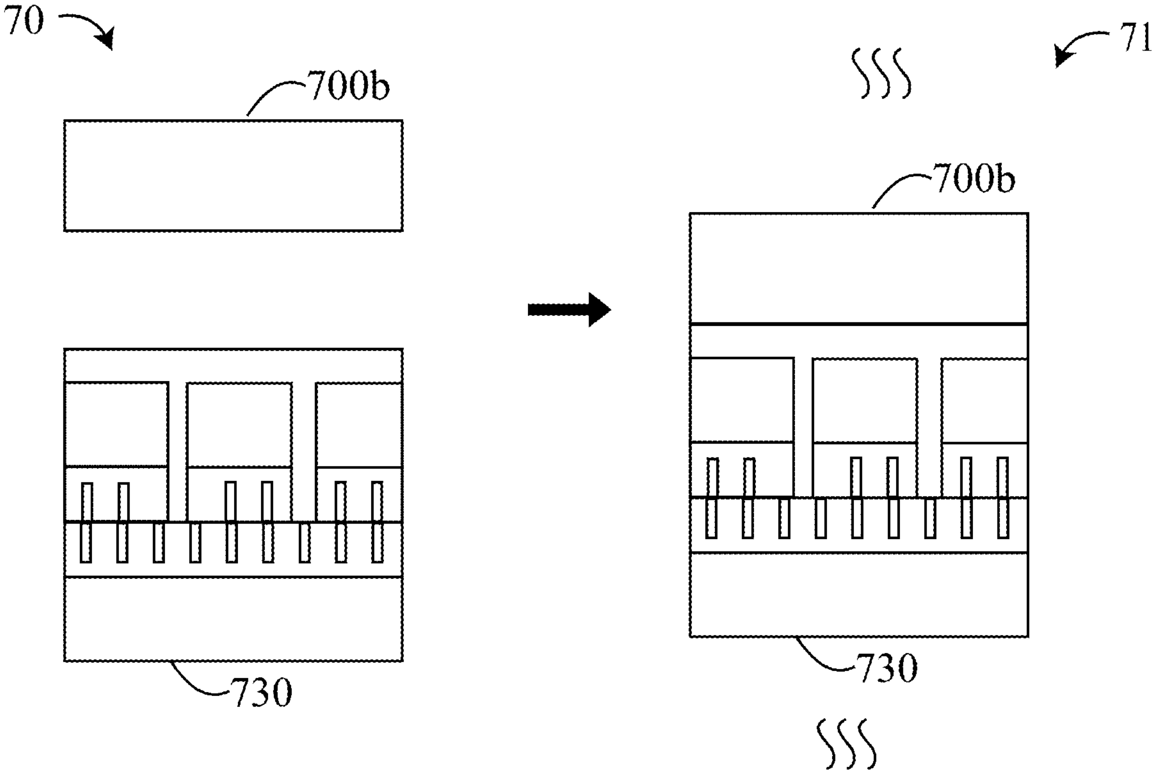
FIG. 7B schematically illustrates aspects of a method of bonding a reconstituted substrate with a fluorine-doped dielectric layer to a substrate, according to some embodiments.

FIG. 7B schematically illustrates aspects of a method of bonding a reconstituted substrate 730 to a substrate 700*b*, according to some embodiments. In some embodiments, the substrate 700*b* is substantially similar to substrate 100*a* of FIG. 1A or the substrate 200*a* of FIG. 2A. In some embodiments, where substrate 700*b* further comprises conductive features in a fluorine-doped dielectric layer, substrate 700*b* may be substantially similar to substrate 300*a* of FIG. 3A, or substrate 400*a* of FIG. 4A.

In some embodiments, where substrate 700*b* is substantially similar to substrate 100*a* of FIG. 1A, block 70 and block 71 may be similar to block 16 and block 17 of FIG. 1C. In some embodiments, where substrate 700*b* is substantially similar to substrate 200*a* of FIG. 2A, blocks 70-71 may be substantially similar to blocks 20-21 of FIG. 2C. In some embodiments, where substrate 700*b* is substantially similar to substrate 300*a* of FIG. 3A, blocks 70-71 may be substantially similar to blocks 33-34 of FIG. 3C. In some embodiments, where substrate 700*b* is substantially similar to substrate 400*a* of FIG. 4A, blocks 70-71 may be substantially similar to blocks 40-41 of FIG. 4C.

Figure 8A:
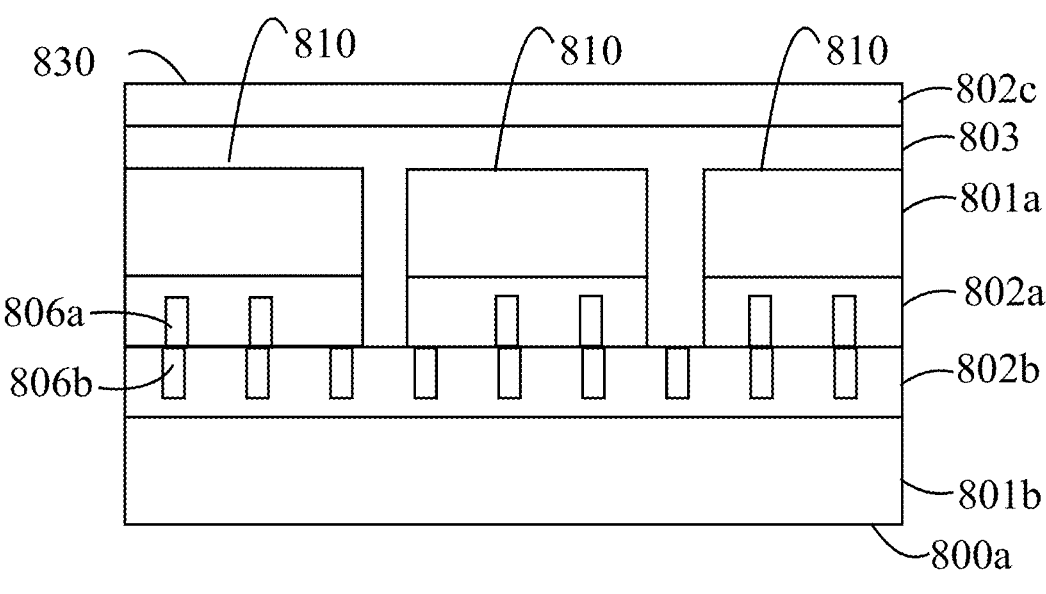
FIG. 8A schematically illustrates a reconstituted substrate with a fluorine-doped dielectric layer, according to some embodiments.

FIG. 8A schematically illustrates a reconstituted substrate 830 with a fluorine-doped dielectric layer 802*c* and a dielectric layer 803, according to some embodiments. The singulated dies 810 each comprise a base layer 801*a*, a fluorine-doped dielectric layer 802*a*, and conductive features 806*a* disposed in the fluorine-doped dielectric layer 802*a*. The substrate 800*a* comprises a base layer 801*b*, a fluorine-doped dielectric layer 802*b*, and conductive features 806*b* disposed in the fluorine-doped dielectric layer 802*b*. The singulated dies 810 and the substrate 800*a* may be substantially similar to the singulated dies 710 and substrate 700*a* as described above in relation to FIG. 7A. A method of preparing the reconstituted substrate 830 may comprise depositing a dielectric layer 803 on the singulated dies 810 and the substrate 800*a*, and polishing the dielectric layer 803. The dielectric layer 803 is not fluorine-doped. The method may comprise depositing a fluorine-doped dielectric layer 802*c* on the dielectric layer 803 and polishing the fluorine-doped dielectric layer 802*c*.

The reconstituted substrate 830 may be prepared for bonding using similar processes as described above in relation to substrate 100*a* in blocks 12-14 of FIG. 1A. In some embodiments, polishing the fluorine-doped dielectric layer 802*c* may occur before or after activating the surface of the fluorine-doped dielectric layer. In some embodiments, polishing the fluorine-doped dielectric layer 802*c* may occur before or after exposing the fluorine-doped dielectric layer 802*c* to hydrogen-containing plasma.

In some other embodiments, the method may comprise forming conductive features disposed in the fluorine-doped dielectric layer 802*c*. For example, the conductive features may be formed on the reconstituted substrate 830 using processes as described above in blocks 30-31 in relation to substrate 300*a* of FIG. 3A. The conductive features may be formed to electrically connect to a device on each singulated die 810.

In other embodiments, conductive features may be formed from existing conductive structures (e.g., vias or interconnects) or conductive layer in the singulated dies 810. For example, the method may include exposing a top portion of conductive structures (e.g., within a dielectric layer) of each singulated die 810, or patterning a conductive layer in the singulated dies 810, depositing a fluorine-doped dielectric layer on the exposed top portion of the conductive structures or patterned conductive layer, and polishing the fluorine-doped dielectric layer. Prior to depositing a fluorine-doped dielectric layer, a barrier layer (e.g., as described above in relation to block 30 in FIG. 3A) may be deposited to separate the fluorine-doped dielectric layer from the conductive structure or patterned conductive layer to prevent metal fluoride formation.

Figure 8B:
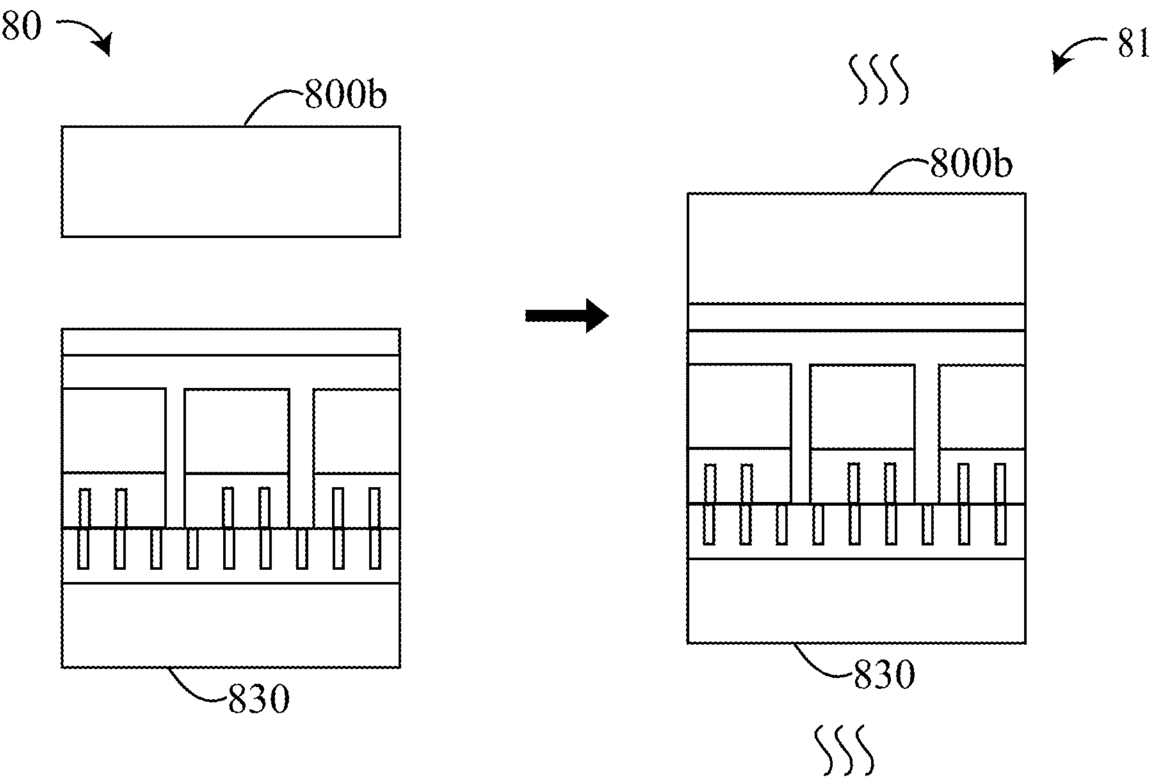
FIG. 8B schematically illustrates aspects of a method of bonding a reconstituted substrate with a fluorine-doped dielectric layer to a substrate, according to some embodiments.

FIG. 8B schematically illustrates aspects of a method of bonding a reconstituted substrate 830 to a substrate 800*b*, according to some embodiments. In some embodiments, the substrate 800*b* is substantially similar to substrate 100*a* of FIG. 1A or the substrate 200*a* of FIG. 2A. In some embodiments, where substrate 830 further comprises conductive features in a fluorine-doped dielectric layer, substrate 800*b* may be substantially similar to substrate 300*a* of FIG. 3A, or substrate 400*a* of FIG. 4A.

In some embodiments, where substrate 800*b* is substantially similar to substrate 100*a* of FIG. 1A, block 80 and block 81 may be similar to block 16 and block 17 of FIG. 1C. In some embodiments, where substrate 800*b* is substantially similar to substrate 200*a* of FIG. 2A, blocks 80-81 may be substantially similar to blocks 20-21 of FIG. 2C. In some embodiments, where substrate 800*b* is substantially similar to substrate 300*a* of FIG. 3A, blocks 80-81 may be substantially similar to blocks 33-34 of FIG. 3C. In some embodiments, where substrate 800*b* is substantially similar to substrate 400*a* of FIG. 4A, blocks 80-81 may be substantially similar to blocks 40-41 of FIG. 4C.

In embodiments where the substrates are bonded using hybrid dielectric and metal bonds, the method may further include planarizing or recessing the metal features below the field surface before contacting and bonding the dielectric material layers. After the dielectric bonds are formed, the substrates may be heated to a temperature between 50° C. to 150° C. or more, or of 150° C. or more and maintained at the elevated temperature for a duration of about 1 hour or more, such as between 8 and 24 hours, to form direct metallurgical bonds between the metal features. Suitable direct dielectric and hybrid bonding technologies that may be used to perform aspects of the methods described herein include ZiBond® and DBI®, each of which are commercially available from Adeia, San Jose, CA, USA.

It is contemplated that any combination of the methods described above may be used to form a bonding structure whether or not expressly recited herein.

The embodiments discussed above are intended to be illustrative and not limiting. One skilled in the art would appreciate that individual aspects of the image sensor, image sensor device, and methods discussed herein may be omitted, modified, combined, and/or rearranged without departing from the scope of the claimed subject matter. Only the claims that follow are meant to set bounds as to what the claimed subject matter includes.

What is claimed is:

1. A method of bonding substrates, the method comprising:

depositing a fluorine-doped dielectric layer on a first substrate;

exposing the fluorine-doped dielectric layer to a hydrogen-containing plasma; and directly bonding the fluorine-doped dielectric layer to a surface of a second substrate without the use of an intervening adhesive.

2. The method of claim 1, wherein the fluorine-doped dielectric layer comprises fluorine-doped silicate glass.

3. The method of claim 1, wherein the method further comprises:

activating a surface of the first substrate prior to depositing the fluorine-doped dielectric layer.

4. The method of claim 3, wherein activating the surface of the first substrate comprises exposing the first substrate to a nitrogen containing solution, a nitrogen-containing plasma, or a combination thereof.

5. The method of claim 1, wherein a concentration of fluorine in the fluorine-doped dielectric layer is less than about 4%.

6. The method of claim 1, wherein the fluorine-doped dielectric layer comprises a substantially uniform concentration of fluorine.

7. The method of claim 1, further comprising:

concurrently with exposing the fluorine-doped dielectric layer to the hydrogen-containing plasma, heating the first substrate to a temperature between about 150° C. to about 200° C.

8. The method of claim 1, further comprising activating the surface of the fluorine-doped dielectric layer by exposing the fluorine-doped dielectric layer to a nitrogen containing solution, a nitrogen-containing plasma, or a combination thereof.

9. The method of claim 8, further comprising:

before or after activating the surface of the fluorine-doped dielectric layer, polishing the fluorine-doped dielectric layer.

10. The method of claim 1, further comprising:

before or after exposing the fluorine-doped dielectric layer to the hydrogen-containing plasma, polishing the fluorine-doped dielectric layer.

11. The method of claim 1, wherein the fluorine-doped dielectric layer is a first dielectric layer, further comprising:

depositing a second dielectric layer on the first substrate before depositing the fluorine-doped dielectric layer on the first substrate.

12. The method of claim 11, wherein a thickness of the fluorine-doped dielectric layer is thinner than a thickness of the second dielectric layer.

13. The method of claim 11, wherein a thickness of the fluorine-doped dielectric layer is less than about 500 nm.

14. The method of claim 11, wherein the fluorine-doped dielectric layer and the second dielectric layer comprise conductive layers.

15. The method of claim 11, wherein:

the second substrate comprises a third dielectric layer; and the surface of the second substrate comprises a surface of the third dielectric layer.

16. The method of claim 15, wherein the third dielectric layer is not fluorine-doped.

17. The method of claim 15, wherein the third dielectric layer is fluorine-doped.

18. The method of claim 15, further comprising:

forming first conductive features in the first dielectric layer; and bonding the first conductive features to second conductive features disposed in the third dielectric layer.

19. The method of claim 15, further comprising:

prior to bonding, activating the surface of the third dielectric layer.

20. The method of claim 18, further comprising:

prior to bonding, activating the surface of the third dielectric layer and a surface of the second conductive features.

* * * * *